(12) United States Patent
Singh et al.

(10) Patent No.: US 10,170,277 B2
(45) Date of Patent: *Jan. 1, 2019

(54) APPARATUS AND METHODS FOR DRY ETCH WITH EDGE, SIDE AND BACK PROTECTION

(75) Inventors: Saravjeet Singh, Santa Clara, CA (US); Graeme Jamieson Scott, Sunnyvale, CA (US); Amitabh Sabharwal, San Jose, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 717 days.

This patent is subject to a terminal disclaimer.

(21) Appl. No.: 13/455,347

(22) Filed: Apr. 25, 2012

(65) Prior Publication Data

US 2012/0305185 A1 Dec. 6, 2012

Related U.S. Application Data

(60) Provisional application No. 61/491,693, filed on May 31, 2011.

(51) Int. Cl.
*C23C 16/00* (2006.01)
*H01J 37/32* (2006.01)

(52) U.S. Cl.
CPC ...... *H01J 37/32082* (2013.01); *H01J 37/321* (2013.01); *H01J 37/32477* (2013.01);
(Continued)

(58) Field of Classification Search
CPC .......... H01J 37/32623; H01J 37/32633; H01J 37/32642; H01J 37/32651; H01J 37/321;
(Continued)

(56) References Cited

U.S. PATENT DOCUMENTS 5,779,803 A * 7/1998 Kurono et al. ........... 118/723 R
5,997,651 A * 12/1999 Matsuse et al. .............. 118/725
(Continued)

FOREIGN PATENT DOCUMENTS

CN 1521805 A 8/2004
CN 101620972 A 1/2010
(Continued)

OTHER PUBLICATIONS

International Search Report and Written Opinion for PCT/US2012/034922 dated Nov. 30, 2012.
(Continued)

*Primary Examiner* — Lux L Alejandro Mulero
(74) *Attorney, Agent, or Firm* — Patterson + Sheridan, LLP

(57) ABSTRACT

Embodiments of the present invention generally relate to a method and apparatus for plasma etching substrates and, more specifically, to a method and apparatus with protection for edges, sides and backs of the substrates being processed. Embodiments of the present invention provide an edge protection plate with an aperture smaller in size than a substrate being processed, wherein the edge protection plate may be positioned in close proximity to the substrate in a plasma chamber. The edge protection plate overlaps edges and/or sides on the substrate to provide protection to reflective coatings on the edge, sides, and back of the substrate.

17 Claims, 6 Drawing Sheets

(52) U.S. Cl.
CPC .. *H01J 37/32623* (2013.01); *H01J 37/32642* (2013.01); *H01J 37/32651* (2013.01)

(58) Field of Classification Search
CPC ............. H01J 37/3211; H01J 37/32119; H01J 37/32128; H01J 37/32137; H01J 37/32146; H01J 37/32155; H01J 37/32165; H01J 37/32174; H01J 37/32183
USPC .......... 118/723 I, 723 IR, 723 AN, 728, 729, 118/730, 504; 156/345.48, 345.49, 156/345.51, 345.52, 345.53; 315/111.51
See application file for complete search history.

(56) References Cited

U.S. PATENT DOCUMENTS

| | | | |
|---|---|---|---|
| 6,178,919 | B1 | 1/2001 | Li et al. |
| 6,974,523 | B2 | 12/2005 | Benzing et al. |
| 7,585,384 | B2 | 9/2009 | Bera et al. |
| 7,618,516 | B2 | 11/2009 | Bera et al. |
| 7,674,353 | B2 | 3/2010 | Bera et al. |
| 7,754,997 | B2 | 7/2010 | Bera et al. |
| 7,780,866 | B2 | 8/2010 | Miller et al. |
| 7,972,467 | B2 | 7/2011 | Bera et al. |
| 7,988,815 | B2 | 8/2011 | Rauf et al. |
| 8,075,728 | B2 | 12/2011 | Balakrishna et al. |
| 8,360,003 | B2 | 1/2013 | Nguyen et al. |
| 2004/0139917 | A1 | 7/2004 | Yamaguchi et al. |
| 2006/0000802 | A1 | 1/2006 | Kumar et al. |
| 2006/0000805 | A1 | 1/2006 | Todorow et al. |
| 2007/0065597 | A1 | 3/2007 | Kaido et al. |
| 2008/0099426 | A1 | 5/2008 | Kumar et al. |
| 2008/0099431 | A1* | 5/2008 | Kumar et al. .................. 216/44 |
| 2008/0305634 | A1 | 12/2008 | Igarashi |
| 2009/0029564 | A1* | 1/2009 | Yamashita et al. ........... 438/788 |
| 2012/0305185 | A1 | 12/2012 | Singh et al. |
| 2014/0130926 | A1 | 5/2014 | Hoffman et al. |

FOREIGN PATENT DOCUMENTS

| | | |
|---|---|---|
| JP | 07-033972 | 6/1995 |
| JP | 2004165645 A | 6/2004 |
| JP | 2004-349587 A | 12/2004 |
| JP | 2008113007 A | 5/2008 |
| JP | 2010192488 A | 9/2010 |
| KR | 10-2000-0030996 | 6/2000 |
| KR | 10-2007-0003172 | 1/2007 |
| TW | 201004485 A | 1/2010 |

OTHER PUBLICATIONS

Second Office Action for Chinese Application No. 201280026218.8 dated Feb. 15, 2016; 12 Total Pages.
Notice of Rejection for Japanese Application No. 2014-513513 dated Nov. 6, 2015; 8 Total Pages.
Official Letter of JP Patent Application 2014-513513 dated Nov. 17, 2015.
Office Action and Search Report for Chinese Application No. 201280026219.8 dated Sep. 15, 2015.
Office Action from Taiwan Patent Application No. 101114960 dated Sep. 7, 2016.
Chinese Office Action dated Aug. 10, 2016 for Application No. 201280026219.8.
Office Action from Japanese Patent Application No. 2014-513513 dated Oct. 25, 2016.
Office Action from Chinese Patent Application Serial Appl. No. 201710866327.0 dated Aug. 28, 2018.

* cited by examiner

APPARATUS AND METHODS FOR DRY ETCH WITH EDGE, SIDE AND BACK PROTECTION

CROSS-REFERENCE TO RELATED APPLICATIONS

This application claims benefit of U.S. Provisional Application Ser. No. 61/491,693, filed May 31, 2011, which is incorporated herein by reference.

BACKGROUND

Field

Embodiments of the present invention generally relate to a method and apparatus for plasma etching substrates and, more specifically, to a method and apparatus with protection for edges, sides and backs of the substrates being processed.

Description of the Related Art

During photolithography, a substrate, such as a photomask, or "reticle," is usually positioned between a light source and a wafer being processed to form patterned features on the wafer. The substrate contains a pattern reflecting configuration of features to be formed on the wafer.

A photomask substrate typically includes a substrate of an optically transparent silicon based material, such as quartz, having a light-shielding metal layer metal, typically chromium, formed on a working surface and a highly reflecting coating, such as chromium nitride, formed on the rest of the surfaces. The light-shielding metal layer is patterned and etched to form features which define the pattern, which corresponds to the features to be transferred by a photolithography process to wafers, such as semiconductor wafers.

Deposition and etching processes are usually employed to fabricate the patterned photomask substrates. The highly reflective coating can be damaged during deposition or etching processes. For example, while using a plasma to etch the pattern in the light shielding metal layer, the highly reflective coating can be degraded if exposed to the plasma. FIG. 1 is a schematic side view of a substrate 100 being processed in a plasma environment. The substrate 100 includes a substrate 102 having a light-shielding metal layer 104 formed on a top surface 112 and a light reflecting coating 106 formed on a bottom surface 114 and side surfaces 116. Traditionally, while forming a pattern on the light-shielding metal layer 104, the substrate 100 is disposed on a supporting assembly 108 with the light-shielding metal layer 104 facing a plasma 110. However, the light reflecting coating 106, particularly the light reflecting coating 106 on the side surfaces 116, may be exposed to the plasma 110 thus being compromised during the process.

Therefore, there is a need for a method and apparatus forming patterns on a substrate without damaging the reflecting coating on the substrate.

SUMMARY

Embodiments of the present invention generally provide apparatus and methods for processing a substrate. More particularly, embodiments of the present invention provide apparatus and methods for protecting edge and/or sides of a substrate during plasma processing.

One embodiment of the present invention provides an apparatus for processing a substrate. The apparatus includes a chamber body defining a processing volume, and a supporting assembly disposed in the processing volume. The supporting assembly comprises a raised portion for supporting a substrate during processing. The apparatus also includes a plasma source configured to generating or supplying a plasma in the processing volume, and an edge protection plate movably disposed in the processing volume above the supporting assembly. The edge protection plate has an aperture formed in a central region.

Another embodiment of the present invention provides an apparatus for processing a substrate. The apparatus includes a chamber body defining a processing volume and a supporting assembly disposed in the processing volume. The chamber body comprises chamber walls and a chamber lid disposed above the chamber walls. The supporting assembly comprises a raised portion for supporting a substrate during processing. The apparatus also includes an antenna disposed above the chamber lid configured to generate a plasma in the processing volume, and an edge protection assembly disposed in the processing volume. The actuated edge protection assembly includes a lift hoop movably disposed in the processing volume, three or more supporting pins extending from the lift hoop, and an edge protection plate having an aperture disposed above the supporting assembly. The edge protection plate is coupled to the three or more supporting pins and movable with the lift hoop.

Yet another embodiment of the present invention provides a method for processing a substrate. The method includes receiving a substrate on a supporting assembly disposed in a processing volume of a plasma chamber, and positioning an edge protection plate above the substrate. The edge protection plate has an aperture smaller than the substrate, and the aperture has substantially the same shape as the substrate. The method further includes generating a plasma above the edge protection plate to process the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a method and apparatus for plasma etching substrates and, more specifically, to a method and apparatus with protection for edges, sides and backs of the substrates being processed. Particularly, embodiments of the present invention provide a processing chamber including an independently actuated edge protection plate.

Embodiments of the present invention provide an edge protection plate with an aperture smaller in size than a substrate being processed, wherein the edge protection plate may be positioned in close proximity to the substrate in a plasma chamber. The edge protection plate overlaps edges and/or sides on the substrate to provide protection to reflective coatings on the edge, sides, and back of the substrate.

The term "substrate" denotes any substrates used in the process of forming electronic devices, such as a semiconductor substrate, an electrical insulator substrate, a mask, a photomask substrate or a reticle.

Figure 2:
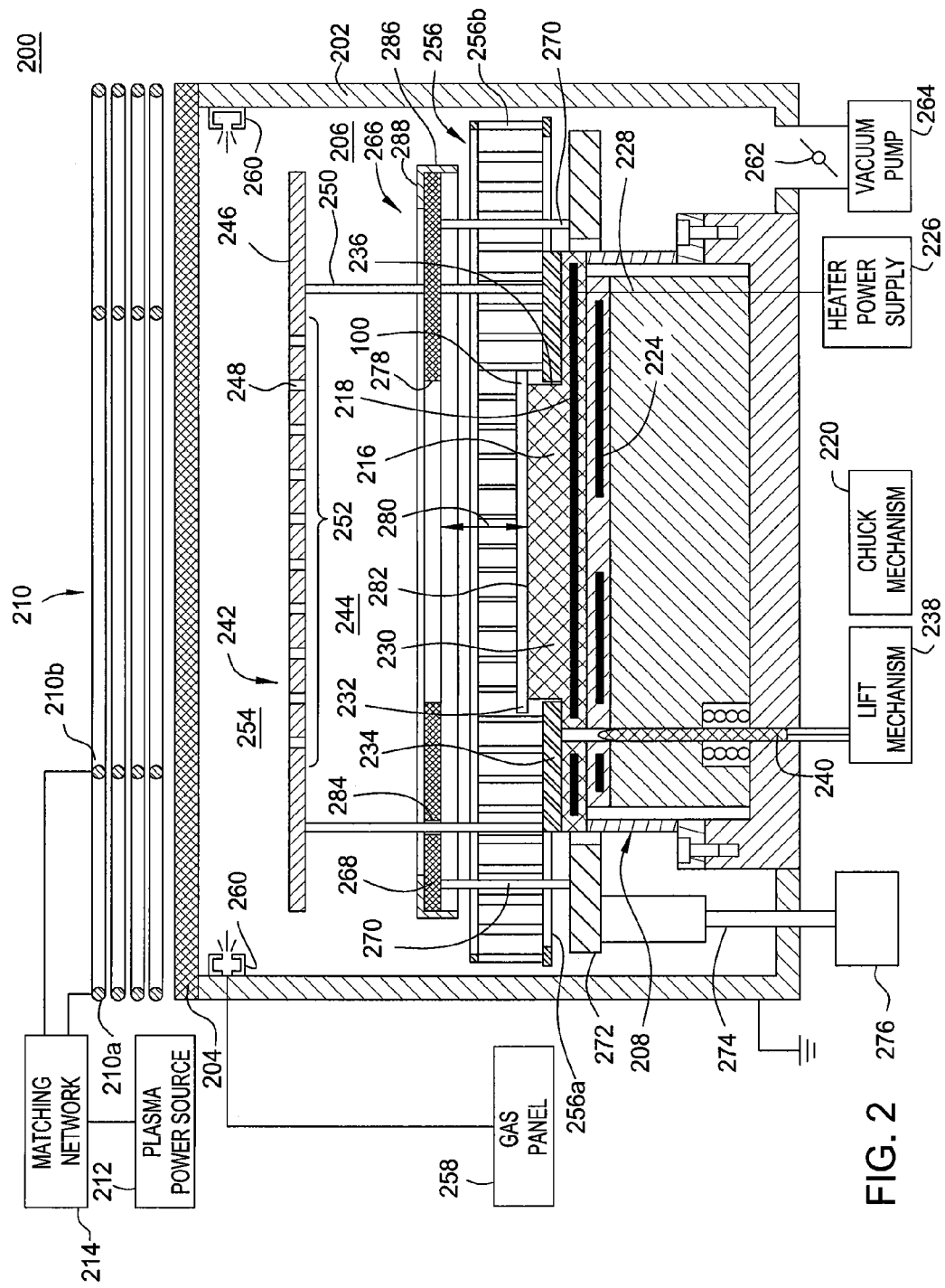
FIG. 2 is a schematic sectional side view of a processing chamber according to one embodiment of the present invention.

FIG. 2 is a schematic sectional side view of a processing chamber 200 according to one embodiment of the present invention. Suitable processing chambers that may be adapted for use with the teachings disclosed herein include, for example, the Decoupled Plasma Source (DPS®) II reactor, or the Tetra I and Tetra II Photomask etch systems, all of which are available from Applied Materials, Inc. of Santa Clara, Calif. The particular embodiment of the processing chamber 200 shown herein is provided for illustrative purposes and should not be used to limit the scope of the invention. It is contemplated that the invention may be utilized in other plasma processing chambers, including those from other manufacturers.

The processing chamber 200 generally includes a processing volume 206 defined by chamber walls 202 and a chamber lid 204. The processing chamber 200 includes a plasma source 222 for supplying or generating a plasma in the processing volume 206. In one embodiment, the plasma source 222 includes an antenna 210 disposed above the chamber lid 204 for generating inductive coupled plasma in the processing volume 206. The antenna 210 may include one or more co-axial coils 210a, 210b as shown in FIG. 2. The antenna 210 may be coupled to a plasma power source 212 via a matching network 214.

A supporting assembly 208 is disposed within the processing volume 206 for supporting the substrate 100 being processed on a raised portion 230. The supporting assembly 208 may include an electrostatic chuck 216, which has at least one clamping electrode 218 connected to a chuck power supply 220. The supporting assembly 208 may include other substrate retention mechanisms such as a susceptor clamp ring, a mechanical chuck, and the like. The supporting assembly 208 may include other substrate retention mechanisms other than the electrostatic chuck 216, such as a susceptor clamp ring, a mechanical chuck, and the like. The supporting assembly 208 may includes a resistive heater 224 coupled to a heater power supply 226 and a heat sink 228 for temperature control.

The supporting assembly 208 also includes a substrate adaptor 234 for transferring the substrate 100 between the raised portion 230 and an exterior transfer device, such as an exterior robot. The substrate adaptor 234 is disposed over the electrostatic chuck 216 and may have an opening 236 allowing the raised portion 230 to extend therethrough. The substrate adaptor 234 may be lifted from the electrostatic chuck 216 by a plurality of lift pins 240 coupled to a lift mechanism 238. Exemplary substrate adaptors are described in U.S. Pat. No. 7,128,806, entitled "Mask Etch Processing Apparatus".

The processing chamber 200 may also include an ion-radical shield 242 disposed above the supporting assembly 208. The ion-radical shield 242 is electrically isolated from the chamber walls 202 and the supporting assembly 208. The ion-radical shield 242 includes a substantially flat plate 246 having a plurality of through holes 248 and a plurality of supporting legs 250 supporting the flat plate 246 and positioning the flat plate 246 at a certain distance above the supporting assembly 208. The plurality of supporting legs 250 may be disposed on the electrostatic chuck 216, the substrate adaptor 234 or the baffle 256. The plurality of through holes 248 may be distributed only within an open area 252 of the flat plate 246. The open area 252 controls the amount of ions that pass from a plasma formed in an upper volume 254 of the processing volume 206 to a lower volume 244 located between the ion-radical shield 242 and the supporting assembly 208. Exemplary ion-radical shields may be found in U.S. Pat. No. 7,909,961, entitled "Method and Apparatus for Photomask Plasma Etching".

A gas panel 258 is connected to inlets 260 for supplying one or more processing gas towards the processing volume 206. A vacuum pump 264 is coupled to the processing volume 206 via a throttle valve 262. A baffle 256 may be disposed around the supporting assembly 208 upstream to the throttle valve 262 to enable even flow distribution in the processing volume 206. The baffle 256 include a plurality of horizontal spokes 256a extending radially outwards from the substrate adaptor 234 to the chamber walls 202. The plurality of horizontal spokes 256a restrict and equalize the fluid flow from the upper portion of the processing volume 206 to the throttle valve 262, thus, improving fluid flow uniformity in the processing volume 206. The baffle 256 may also include a plurality of vertical bars 256b extending upward from an outer edge of the baffle 256. The plurality of vertical bars 256b functions to restrict and adjust fluid flow in horizontal direction near the substrate 100 during processing.

In one embodiment, an edge shield 286 may be coupled to the edge protection plate 268. The edge shield 286 is a ring shaped tube having an inward step 288. The edge shield 286 rests on a periphery edge of the edge protection plate 268 to direct gas flow around the edge protection plate 268.

Figure 1:
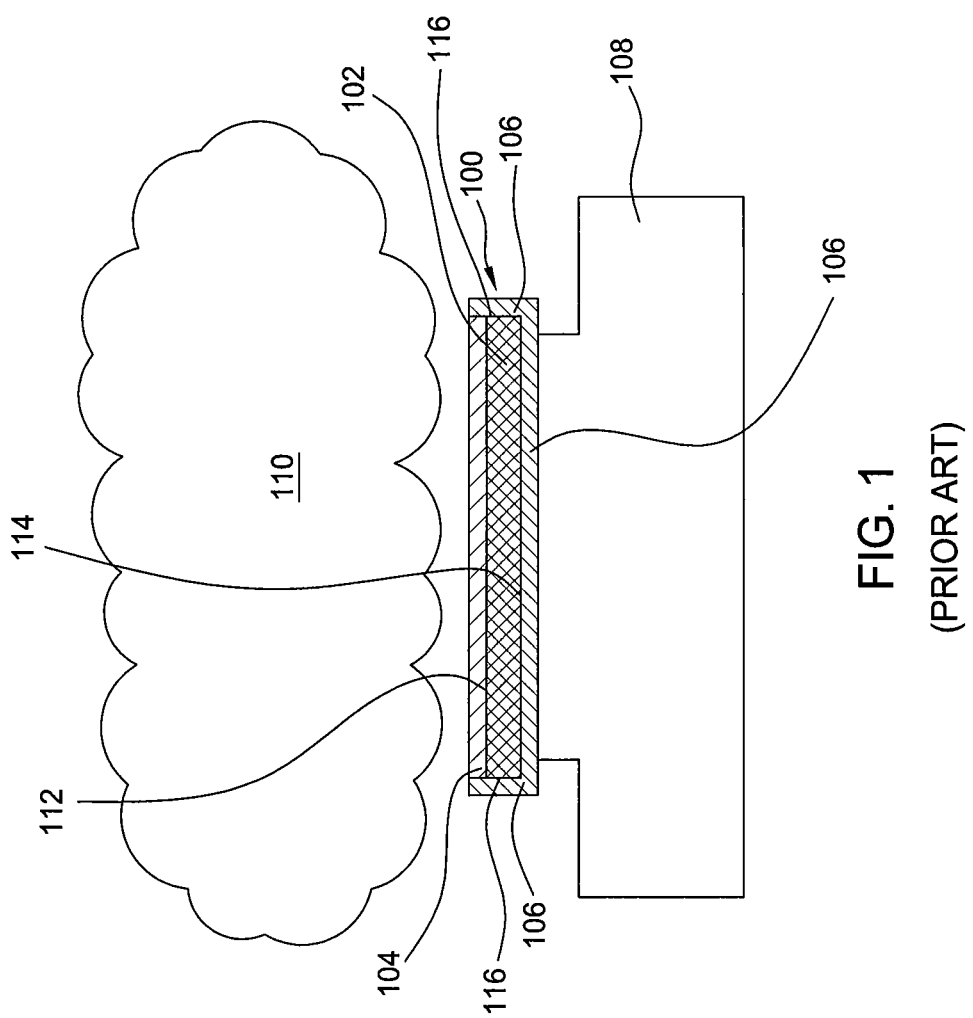
FIG. 1 is a schematic side view of a substrate being processed in a plasma environment.

The processing chamber 200 according to embodiments of the present invention includes an actuated edge protection assembly 266 configured to provide protection to the light reflective coating 106 of the substrate 100. The actuated edge protection assembly 266 may be used to protect the light reflective coating 106 both on the edge 232 and/or side surfaces 116 (shown in FIG. 1) of the substrate 100.

The actuated edge protection assembly 266 includes an edge protection plate 268, a lift hoop 272, three or more supporting pins 270 coupled between the lift hoop 272 and the edge protection plate 268. An actuator 276 is coupled to the lift hoop 272 by a shaft 274 that sealingly extends through the chamber walls 202.

The lift hoop 272 is disposed in the processing volume 206 radially outwards of the supporting assembly 208. The lift hoop 272 is mounted on the shaft 274 in a substantially horizontal orientation. The shaft 274 is driven by the actuator 276 to move the lift hoop 272 vertically in the processing volume 206. The three or more supporting pins 270 extend upward from the lift hoop 272 and position the edge protection plate 268 above the supporting assembly 208. The three or more supporting pins 270 may fixedly attach the edge protection plate 268 to the lift hoop 272. The edge protection plate 268 moves vertically with the lift hoop 272 in the processing volume 206 so that the edge protection plate 268 can be positioned at a desired distance above the substrate 100 and/or an exterior substrate handling device can enter the processing volume 206 between the edge protection plate 268 and the supporting assembly 208 to transfer the substrate 100.

The three or more supporting pins 270 may be positioned to allow the substrate 100 to be transferred in and out the processing chamber 200 between the supporting pins 270. In one embodiment, each of the three or more supporting pins 270 may be positioned close to one of the plurality of supporting legs 250 supporting the ion-radical shield.

In one embodiment, the edge protection plate 268 is a planar plate in a size greater than a diameter of the supporting assembly 208 and slightly smaller than to the inner dimension of the chamber wall 202 so that the edge protection plate 268 can block the downward flow of the processing gas or plasma in the processing volume 206. In one embodiment, the chamber wall 202 is cylindrical and the edge protection plate 268 may be a circular disk having an outer diameter slightly smaller than an inner diameter of the chamber wall 202. The edge protection plate 268 has an aperture 278 formed near a central region. The edge protection plate 268 may be positioned substantially parallel to the top surface 282 of the supporting assembly 208. The aperture 278 is aligned with the raised portion 230 of the electrostatic chuck 216. The aperture 278 provides a restricted path for the processing gas, or active species, that directs the gas downwards toward the raised portion 230 where the substrate 100 is positioned, thus, controlling the plasma-exposure of the substrate 100.

The shape of the aperture 278 may be substantially similar to the shape of the substrate 100 being processed. For example, the shape of the aperture 278 may be square, rectangular, circular, triangular, oval, circular with a flat, hexagonal, octagonal, or any suitable shape of a processing region on a substrate being processed. In one embodiment, the aperture 278 may be slightly smaller than a top surface 112 of the substrate 100 to provide protection to the edge 232 of the substrate 100. In one embodiment, a distance 280 between the edge protection plate 268 and a top surface 282 of the raised portion 230 can be adjusted to achieve desired plasma-exposure of the substrate 100. In another embodiment, the size of the aperture 278 can be adjusted to achieve desired plasma-exposure of the substrate 100.

Alternately, the distance 280 and the size of the aperture 278 can be adjusted to together to achieve desired plasma-exposure of the substrate 100. When the size of the aperture 278 is slightly smaller than the size of the substrate 100, the edge 232 of the substrate 100 may be shielded by the edge protection plate 268 from any species in the process gas descending from the processing volume 206 above. The smaller of the aperture 278, the larger the area of the edge 232. On the other hand, changing of the distance 280 also changes how edge protection plate 268 affects the substrate 100. When the size of the aperture 278 remains the same, a small distance 280 will result in a protected edge zone sharply defined from the non-protected zone on the substrate 100 while a large distance 280 will result in a transitional region between the protected and non-protected regions.

In one embodiment, the edge protection plate 268 is movably positioned below the ion-radical shield 242 and above the supporting assembly 208. The edge protection plate 268 may have a plurality of through holes 284 to accommodate the plurality of supporting legs 250 that are supporting the flat plate 246 of the ion-radical shield 242.

During processing, a plasma is usually formed in the processing volume 206. Species in the plasma, such as radials and ions, passes through the flat plate 246 and the aperture 278 of the edge protection plate 268 to the substrate 100. The edge protection plate 268 protects the edge and/or sides of the substrate 100 from bombardment of the species in the plasma by physically blocking species in the plasma. The edge protection plate 268 provides a physical shield to chamber components and regions of substrate 100 below the edge protection plate 268 except the regions below the aperture 278. The aperture 278 may be shaped and/or positioned so that species passing through the aperture 278 do not reach the edge and/or sides of the substrate 100. As discussed above, the size of the aperture 278 and/or the distance 280 may be adjusted alone or together to obtain desired protection on the substrate 100.

The edge protection plate 268 may be formed from materials that are compatible with the processing chemistry. In one embodiment, the edge protection plate 268 may be formed from quartz or ceramics, such as alumina, yttria (yttrium oxide), and K140 (a proprietary material available from Kyocera), among others.

Figure 3:
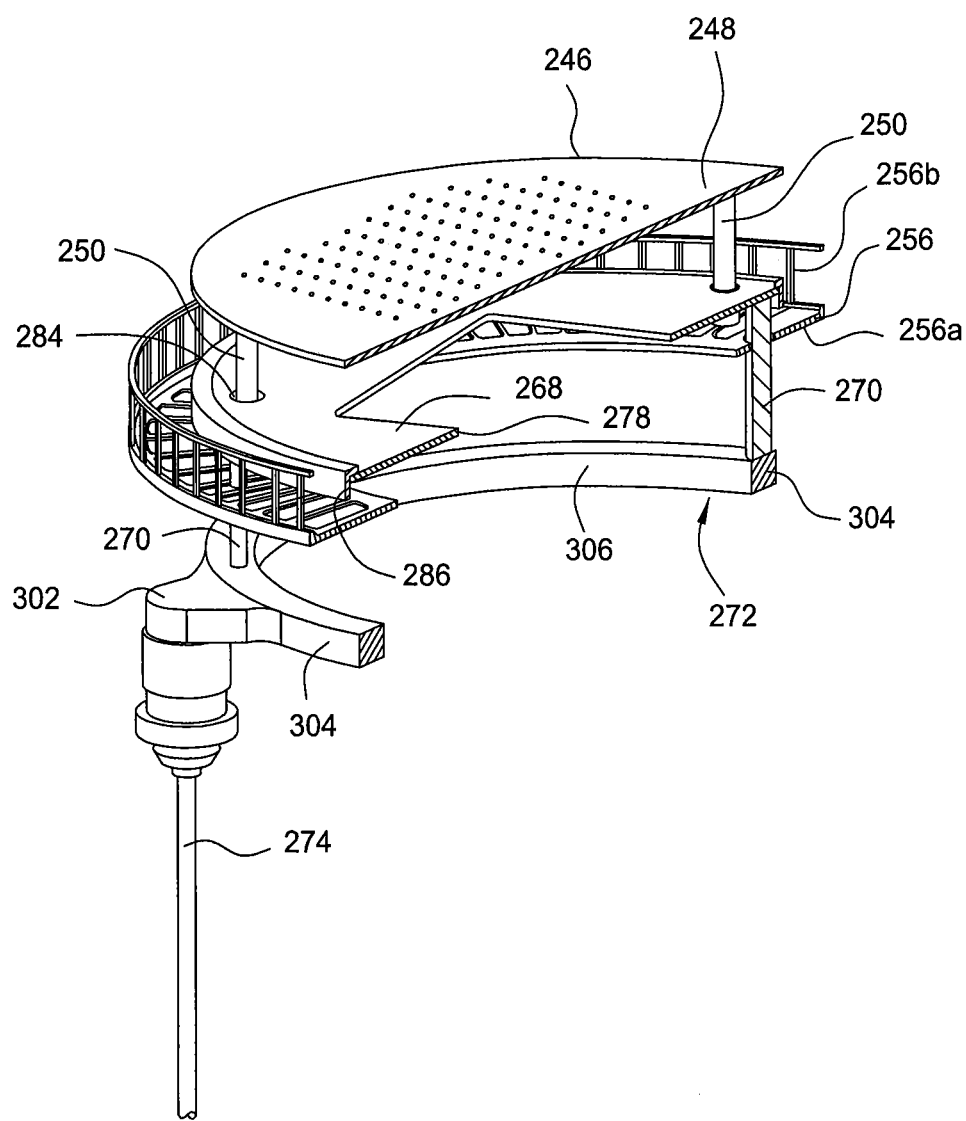
FIG. 3 is a partial perspective view of an edge protection assembly according to one embodiment of the present invention.

FIG. 3 is a partial perspective view of the actuated edge protection assembly 266 according to one embodiment of the present invention with the chamber lid 204, chamber walls 202 and supporting assembly 208 removed. As shown in FIG. 3, the plurality of supporting pins 270 penetrate the baffle 256 to position the edge protection plate 268 between the baffle 256 and the flat plate 246. The plurality of through holes 284 accommodate the supporting legs 250 supporting the flat plate 246 on the baffle 256. The staggered arrangement of supporting legs 250 and supporting pins 270 allows the edge protection plate 268 to move independently from the baffle 256 and the flat plate 246.

The edge protection plate 268 is moved vertically by the lift hoop 272. The lift hoop 272 may include a ring shaped body 304 having a side extension 302. The ring shaped body 304 has an inner opening 306 large enough to surround the supporting assembly 208. The side extension 302 is located radially outwards from the ring shaped body 304. The side extension 302 allows the lift loop 272 to connect with an actuator from the side. The side driven arrangement enables the lift hoop 272 and the edge protection plate 268 to have a separate driven mechanism from the baffle 256 and the flat plate 246 of the ion-radical shield 242, thus, improving the process flexibility of the processing chamber 200.

The movable edge protection plate 268 may be positioned at different distances above the supporting assembly 208 to achieve certain effect and/or enable movements of the substrate 100 and other chamber opponents. The ability to adjustably set the elevation of the edge protection plate 268 relative to the supporting assembly 208 significantly enlarges the processing window, allowing greater process flexibility. In one embodiment, the elevation of the edge protection plate 268 may be adjusted to customarily fit different processing recipes prior to plasma processing. In another embodiment, the elevation of the edge protection plate 268 may be adjusted during a plasma processing.

Figure 4A:
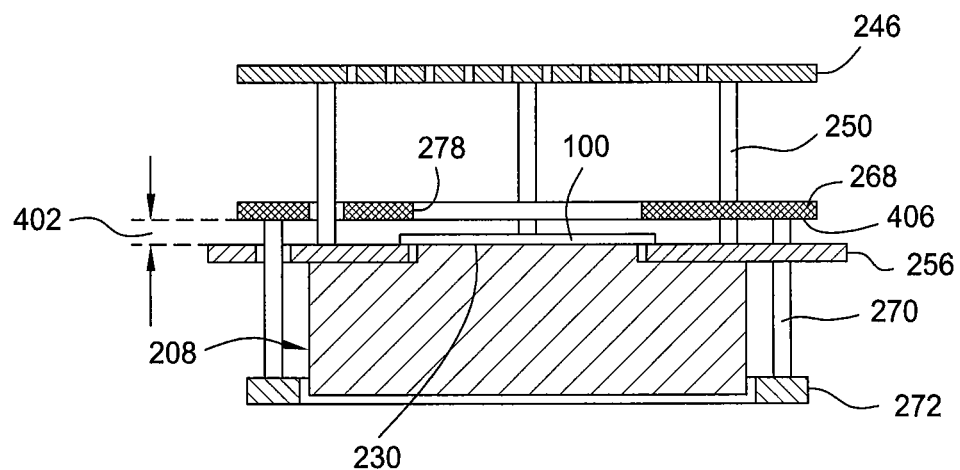
FIG. 4A is a sectional side view showing an edge protection plate in a lower processing position.

FIG. 4A is a sectional side view showing the edge protection plate 268 in a lower processing position. A lower surface 406 is positioned at a distance 402 above the raised portion 230 of the supporting assembly 208. At the lower processing position, the distance 402 is relatively short placing the edge protection plate 268 close to the substrate 100 being processed. At the lower processing position, the edge protection plate 268 may function like a shadow ring preventing plasma access to any area that is substantially outside the direct line of sight through of the aperture 278 and the edge 232 of the substrate 100 is shadowed from exposures to ions.

Figure 4B:
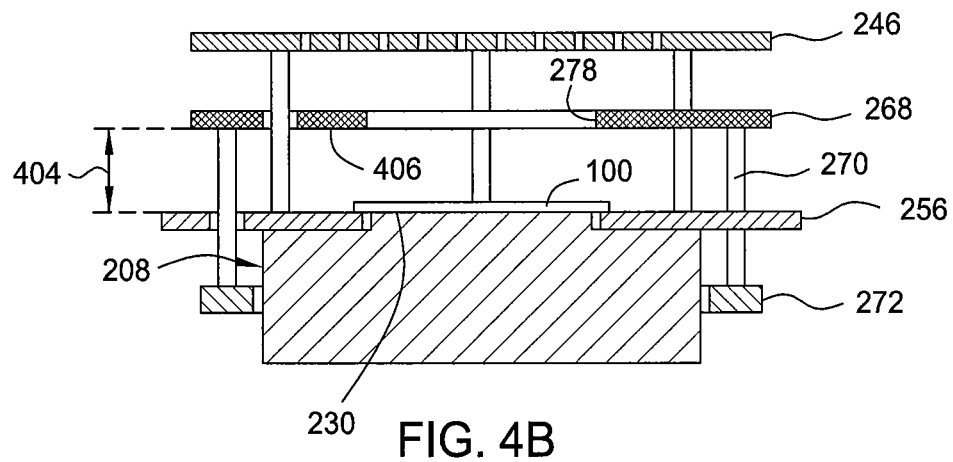
FIG. 4B is a sectional side view showing the edge protection plate in an upper processing position.

FIG. 4B is a sectional side view showing the edge protection plate 268 in an upper processing position. The lower surface 406 is positioned at a distance 404 above the raised portion 230 of the supporting assembly 208. The distance 404 is greater than the distance 402, thus allowing more ions and reactive species to interact with the edge of the substrate 100 which would have been shadowed by the edge protection plate 268 in the lower processing position. At the upper processing position, the edge protection plate 268 may protect the edge and/side of the substrate 100 from exposure to the plasma as well as regulate the etch rate close to the edge region of the substrate, thus improving overall processing uniformity across the substrate 100.

Figure 4C:
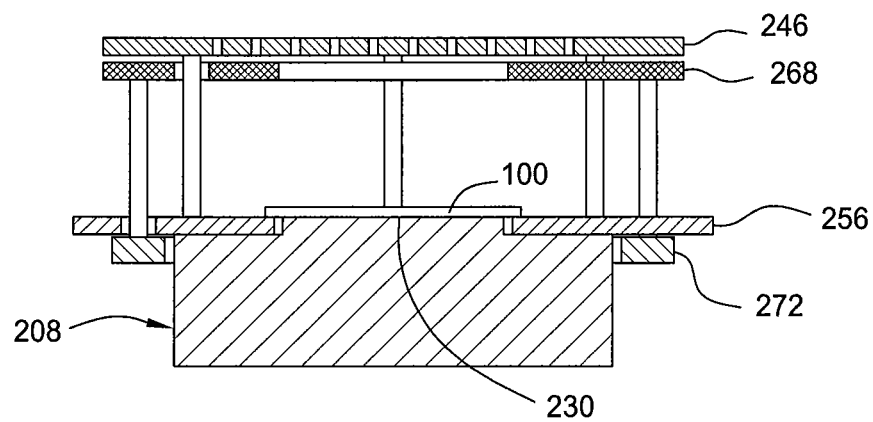
FIG. 4C is a sectional side view showing the edge protection plate in a substrate transfer position.

FIG. 4C is a sectional side view showing the edge protection plate 268 in a transferring position so that the substrate 100 can be transferred to and from the supporting assembly 208. The lift hoop 272 and the edge protection plate 268 are raised in close proximity to the ion radical shield 242, thereby, creating sufficient space between the edge protection plate 268 and the raise portion 230 to allow access by a robot blade for substrate transferring.

Edge protection plates according to embodiments of the present invention generally include a planar body having an aperture in a shape similar to the substrates being processed. In one embodiment, the aperture is in a square shape. However, the shape of the aperture 278 may be any suitable shape for a processing region on a substrate being processed, such as square, rectangular, circular, triangular, oval, circular with a flat, hexagonal, or octagonal.

Figure 5A:
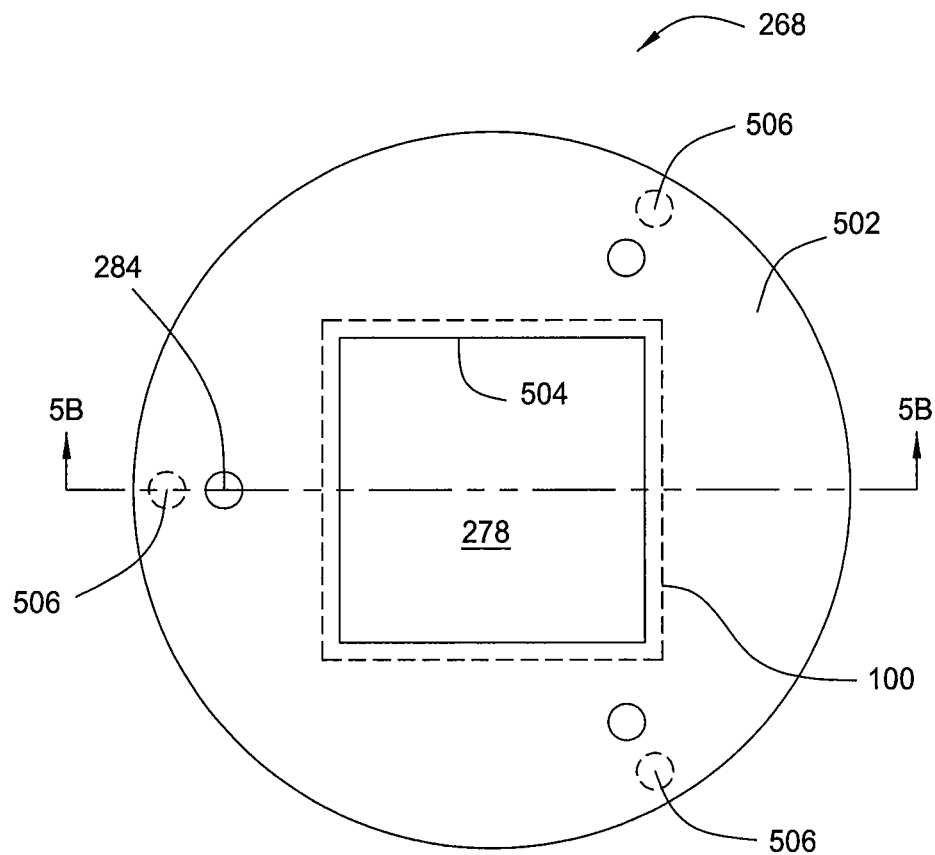
FIG. 5A is a top view of an edge protection plate according to one embodiment of the present invention.
Figure 5B:
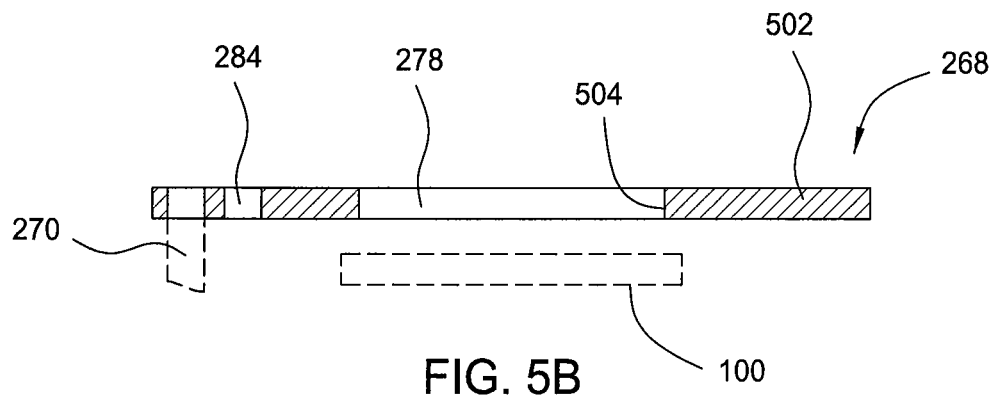
FIG. 5B is a sectional side view of the edge protection plate of FIG. 5A.

FIG. 5A is a top view of the edge protection plate 268 according to one embodiment of the present invention. FIG. 5B is a sectional side view of the edge protection plate 268. The edge protection plate 268 has a planar disk shaped body 502. The planar disk shaped body 502 may be circular for using in a processing chamber having cylindrical sidewalls. The aperture 278 is formed through a central area of the planar disk shaped body 502. The aperture 278 may be square for processing a square substrate 100. The aperture 278 is defined by substantially vertical inner walls 504. In one embodiment, the size of the aperture 278 may be slightly less than 26 square inches which is smaller than the size of the substrate 100. During processing, the aperture 278 is coaxially aligned with a center of the substrate 100 and the supporting assembly 208 to provide uniform protection around the edges and sides of the substrate 100.

In one embodiment, three or more through holes 284 are formed along the periphery of the planar disk shaped body 502. The through holes 284 are configured to accommodate supporting legs 250 of the ion-radical shield 242. Supporting features, such as supporting pins 270, may be attached to the planar disk shaped body 502 at locations 506. The locations 506 may be positioned close to and radially aligned with the through holes 284 so that the substrate 100 may be transferred between neighboring supporting pins 270.

It should be noted that the edge protection plate 268 and the aperture 278 may have different shapes depending on the shape of the chamber and the shape of the substrate respectively.

Figure 6A:
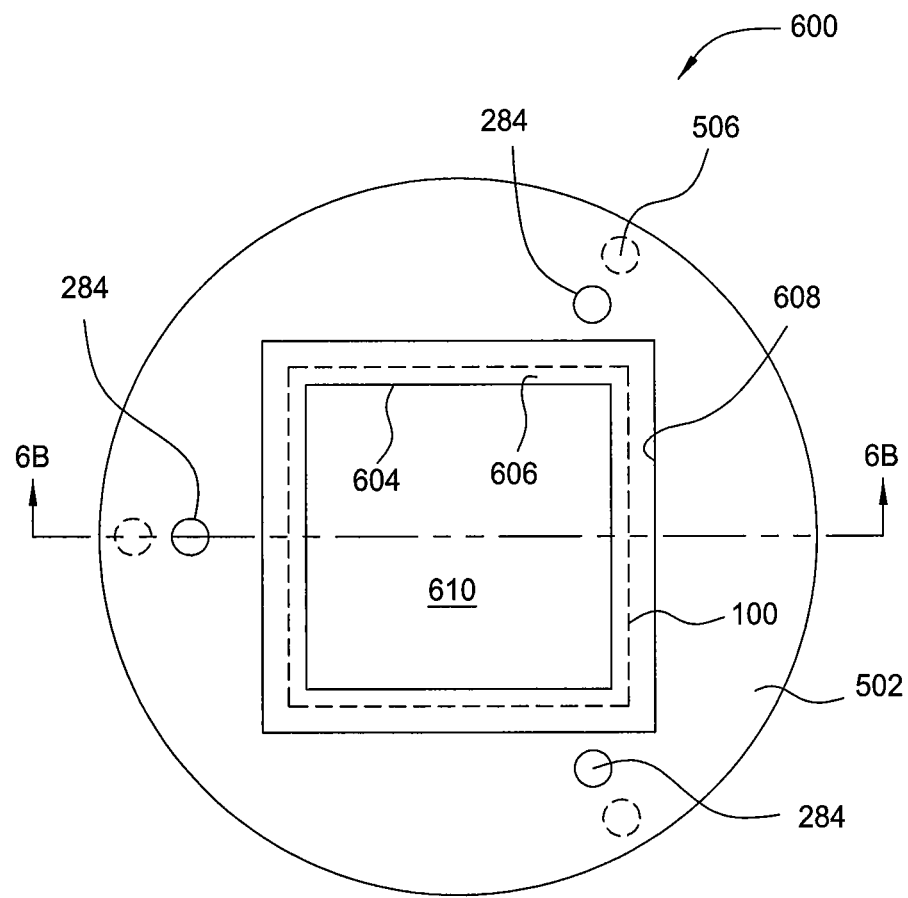
FIG. 6A is a top view of an edge protection plate according to one embodiment of the present invention.
Figure 6B:
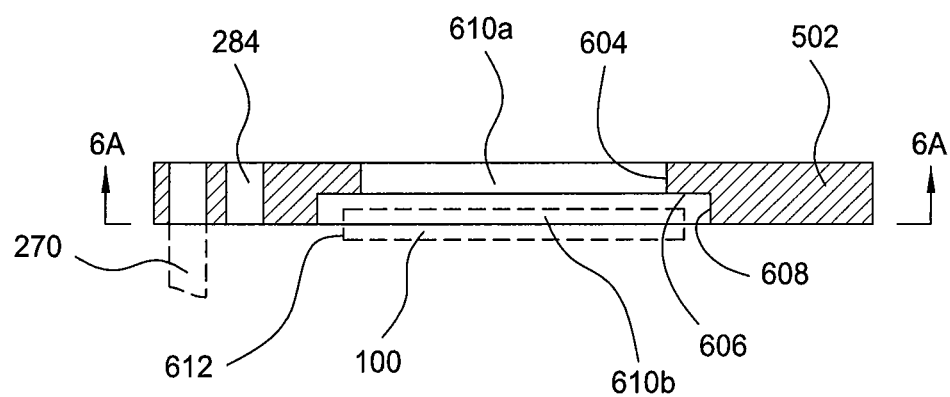
FIG. 6B is a sectional side view of the edge protection plate of FIG. 6A.

FIG. 6A is a top view of an edge protection plate 600 according to another embodiment of the present invention. FIG. 6B is a sectional side view of the edge protection plate 600. The edge protection plate 600 is configured to provide additional protection to the sides 612 of the substrate 100 shown in phantom in FIG. 6B.

The edge protection plate 600 is similar to the edge protection plate 268 except that the edge protection plate 600 has an aperture 610 defined by stepped sidewalls. The aperture 610 may be shaped substantially similar to the shape of the substrate 100 being processed. The aperture 610 is defined by upper inner walls 604, a step 606, and a lower inner wall 608. The upper inner walls 604 form an upper opening 610a smaller than the substrate 100 and the lower inner walls 608 form a lower opening 610b larger than the substrate 100.

During processing, the substrate 100 may be positioned within the lower opening 610b so that the lower inner walls 608 directly shield the sides 612 of the substrate 100 from plasma exposure while the upper opening 610a allows species in the plasma to process the substrate 100.

Advantages of the edge protection plates according to embodiments of the present invention may include the following.

The edge protection plate may be independently actuated such that the distance from the edge of the substrate to the edge protection plate can be regulated. The independent actuation allows the edge protection plate to be position in a close proximity to the substrate. The close proximity of the edge protection plate to the substrate allows the edge protection plate to effectively shadow and block the reactive plasma from etching or otherwise damaging the reflective coating on the sides or backside of the substrate. As a result, the edge protection plate significantly reduces the etch rate on the sides and backside of substrate thus protecting reflective coating on the substrate from plasma attack.

Furthermore, the edge protection plate can also be used to regulate the etch rate close to the edge of the substrate thus affecting the overall uniformity of etch process on the substrate.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
   a chamber body having a chamber sidewall and a bottom defining a processing volume;
   a supporting assembly disposed in the processing volume, wherein the supporting assembly comprises a raised portion for supporting the substrate during processing;
   a plasma source configured to generating or supplying a plasma in the processing volume;
   an edge protection plate movably disposed in the processing volume above and spaced apart from the supporting assembly, wherein the edge protection plate has a center opening formed in a central region and the center opening has substantially vertical walls, wherein the center opening has a size to shield only an edge of the substrate during processing, wherein the edge protection plate further includes a plurality of through holes formed therein, wherein the through holes are configured to allow a first plurality of supporting legs passing therethrough from the supporting assembly and the edge protection plate is spaced apart from the chamber sidewalls; and
an edge shield disposed against a periphery of the edge protection plate and spaced apart from the support assembly and the chamber sidewalls, the edge shield covering a vertical sidewall of the edge protection plate.

2. The apparatus of claim 1, further comprising a lift hoop coupled to the edge protection plate, wherein the lift hoop is vertically movable within the processing volume.

3. The apparatus of claim 2, further comprising a shaft extending from the lift hoop, wherein the lift hoop is disposed around the supporting assembly, and the shaft connects the lift hoop to an actuator.

4. The apparatus of claim 2, further comprising a second plurality supporting pins that fixedly attach the edge protection plate to the lift hoop.

5. The apparatus of claim 2, further comprising:
an ion-radical shield disposed above the edge protection plate in the processing volume, wherein the first plurality of supporting legs supports the ion-radical shield and passes though the through holes of the edge protection plate.

6. The apparatus of claim 5, wherein each of the plurality of supporting legs passes through one of the first plurality of through holes of the edge protection plate to allow the edge protection plate to move independent from the ion-radical shield.

7. The apparatus of claim 2, wherein the center opening is shaped substantially similar to the substrate being processed.

8. The apparatus of claim 7, wherein the center opening is smaller in size than the substrate.

9. The apparatus of claim 7, wherein the center opening is defined by an upper opening and a lower opening, the lower opening is larger than the upper opening.

10. The apparatus of claim 1, wherein the edge protection plate is formed from quartz or ceramic.

11. An apparatus for processing a substrate, comprising:
a chamber body defining a processing volume, wherein the chamber body comprises chamber walls and a chamber lid disposed above the chamber walls;
a supporting assembly disposed in the processing volume, wherein the supporting assembly comprises a raised portion for supporting a substrate during processing;
an antenna disposed above the chamber lid configured to generate a plasma in the processing volume; and
an edge protection assembly disposed in the processing volume, wherein the edge protection assembly comprises:
an actuator;
an edge protection plate having a center opening disposed above and spaced apart from the supporting assembly, wherein the center opening has substantially vertical walls, wherein the center opening has a size to shield only an edge of the substrate during processing and the edge protection plate is coupled to the actuator, and an elevation of the edge protection plate is controlled by the actuator, wherein the edge protection plate includes a plurality of through holes formed therein configured to allow a first plurality of supporting legs passing therethrough from the supporting assembly and the edge protection plate is spaced apart from the chamber sidewalls; and
an edge shield disposed against a periphery of the edge protection plate, the edge shield covering a vertical sidewall of the edge protection plate, wherein the edge shield is spaced apart from the support assembly and the chamber sidewalls.

12. The apparatus of claim 11, wherein the center opening of the edge protection plate is square.

13. The apparatus of claim 11, wherein the edge protection plate is formed from quartz or ceramic.

14. The apparatus of claim 11, further comprising:
an ion-radical shield disposed above the edge protection plate in the processing volume, wherein the plurality of supporting legs supports the ion-radical shield and passes through the through holes of the edge protection plate.

15. An apparatus for processing a substrate, comprising:
a chamber body defining a processing volume, wherein the chamber body comprises chamber walls and a chamber lid disposed above the chamber walls;
a supporting assembly disposed in the processing volume, wherein the supporting assembly comprises a raised portion for supporting a substrate during processing;
an antenna disposed above the chamber lid configured to generate a plasma in the processing volume; and
an edge protection assembly disposed in the processing volume, wherein the edge protection assembly comprises:
an actuator;
an edge protection plate having a center opening disposed above and spaced apart from the supporting assembly, wherein the edge protection plate is coupled to the actuator, an elevation of the edge protection plate is controlled by the actuator, the center opening is defined by an upper opening and a lower opening, the lower opening is larger in size than the upper opening, and the center opening has substantially vertical walls, wherein the center opening has a size to shield only an edge of the substrate during processing, wherein the edge protection plate further includes a plurality of through holes formed therein, wherein the through holes are configured to allow a plurality of supporting legs passing therethrough from the supporting assembly and the edge protection plate is spaced apart from the chamber sidewalls; and
an edge shield disposed against a periphery of the edge protection plate, the edge shield covering a vertical sidewall of the edge protection plate, wherein the edge shield is spaced apart from the support assembly and the chamber sidewalls.

16. The apparatus of claim 15, wherein the edge protection plate is formed from quartz or ceramic.

17. The apparatus of claim 15, further comprising:
an ion-radical shield disposed above the edge protection plate in the processing volume, wherein the plurality of supporting legs supports the ion-radical shield and passes through the through holes of the edge protection plate.

* * * * *